(12) United States Patent  
Fitzpatrick et al.

(10) Patent No.: US 8,908,812 B2  
(45) Date of Patent: Dec. 9, 2014

(54) METHODS AND APPARATUS FOR MAP DETECTION WITH REDUCED COMPLEXITY

(71) Applicant: AGERE Systems LLC, Allentown, PA (US)

(72) Inventors: Kelly K. Fitzpatrick, Sudbury, MA (US); Erich F. Haratsch, Bethlehem, PA (US)

(73) Assignee: AGERE Systems LLC, Allentown, PA (US)

( * ) Notice: Subject to any disclaimer, the term of this patent is extended or adjusted under 35 U.S.C. 154(b) by 0 days.

(21) Appl. No.: 13/736,661

(22) Filed: Jan. 8, 2013

(65) Prior Publication Data

US 2013/0120867 A1 May 16, 2013

Related U.S. Application Data

(63) Continuation of application No. 12/017,765, filed on Jan. 22, 2008, now Pat. No. 8,711,984.

(51) Int. Cl.
| | |
|---|---|
| *H04L 27/06* | (2006.01) |
| *H03M 13/41* | (2006.01) |
| *H04L 1/00* | (2006.01) |
| *G11B 5/09* | (2006.01) |
| *H03M 13/00* | (2006.01) |
| *H03M 13/39* | (2006.01) |

(52) U.S. Cl.
CPC .............. *G11B 5/09* (2013.01); *H04L 1/0055* (2013.01); *H03M 13/6343* (2013.01); *H04L 1/0066* (2013.01); *H03M 13/395* (2013.01); *H03M 13/6502* (2013.01); *H03M 13/3905* (2013.01)
USPC ........................................ 375/340

(58) Field of Classification Search
CPC .......... H03M 13/395; H03M 13/3905; H03M 13/3927; H03M 13/6502; H04L 1/0055
USPC ......................................... 375/316, 340, 341
See application file for complete search history.

(56) References Cited

U.S. PATENT DOCUMENTS 6,452,979 B1 * 9/2002 Ariel et al. ..................... 375/265
6,658,071 B1 * 12/2003 Cheng ............................ 375/348

(Continued)

FOREIGN PATENT DOCUMENTS

| EP | 1 394 953 A2 | 3/2004 |
|---|---|---|
| EP | 1850486 | 10/2007 |
| WO | WO 2006/082923 | 8/2006 |

OTHER PUBLICATIONS

Lee et al. Area-Efficient High-Throughput MAP Decoder Architectures, IEEE Transactions on Very Large Scale Integration (VLSI) Systems, vol. 13, No. 8, pp. 921-933, Aug. 2005.

*Primary Examiner* — Kevin M Burd

(57) ABSTRACT

Methods and apparatus are provided for high-speed, low-power, high-performance channel detection. A soft-output detector is provided for processing a received signal, comprising: a forward detector for calculating forward state metrics; a backward detector for calculating backward state metrics; and a current branch detector for calculating a current branch metric, wherein at least two of the forward detector, the backward detector and the current branch detector employ trellis structures with a different number of states. A method is provided for processing a received signal using a soft-output detector, comprising: calculating forward state metrics using a forward detector; calculating backward state metrics using a backward detector; and calculating a current branch metric using a current branch detector, wherein at least two of the forward detector, the backward detector and the current branch detector employ trellis structures with a different number of states.

20 Claims, 11 Drawing Sheets

(56) References Cited

U.S. PATENT DOCUMENTS

| | | | |
|---|---|---|---|
| 2002/0071504 A1* | 6/2002 | Chen et al. | 375/341 |
| 2003/0139927 A1 | 7/2003 | Gabara et al. | |
| 2004/0044946 A1 | 3/2004 | Bickerstaff et al. | |
| 2007/0136649 A1 | 6/2007 | Seo et al. | |
| 2007/0283230 A1* | 12/2007 | Brannstrom et al. | 714/777 |
| 2009/0274239 A1* | 11/2009 | Efimov et al. | 375/285 |

* cited by examiner

FULL-RATE TRELLIS 110

QUARTER-RATE TRELLIS 120

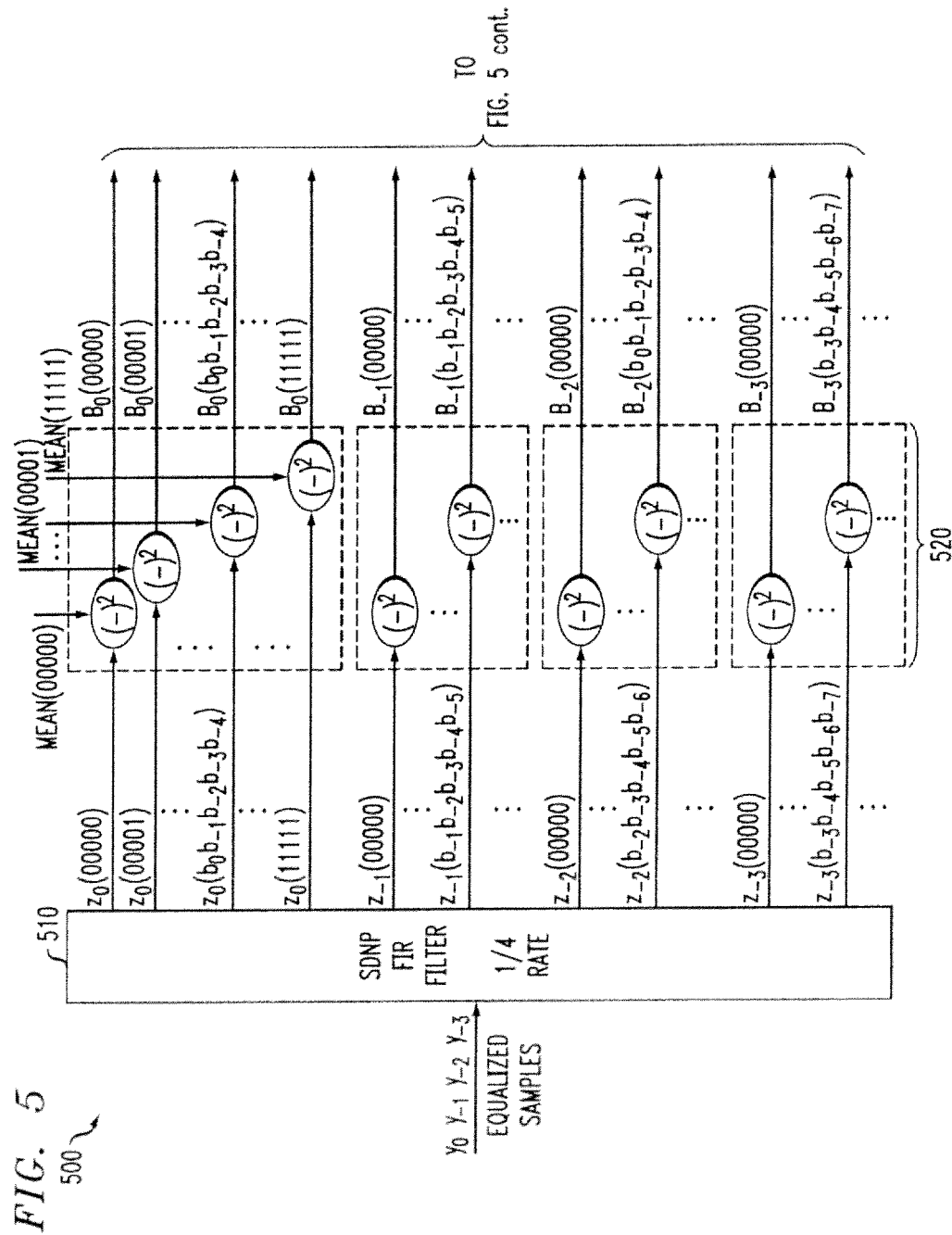

METHODS AND APPARATUS FOR MAP DETECTION WITH REDUCED COMPLEXITY

CROSS-REFERENCE TO RELATED APPLICATIONS

This application is a divisional of U.S. patent application Ser. No. 12/017,765, filed Jan. 22, 2008, incorporated by reference herein.

FIELD OF THE INVENTION

The present invention relates generally to equalization, detection and decoding using maximum-a-posteriori (MAP) detection techniques.

BACKGROUND OF THE INVENTION

Disk-drives contain a signal-processing chip, often referred to as a "read channel chip," that converts the noisy analog signal from the magnetic recording head into the binary data sequence that is used by the host computer. A major component in a read channel chip is the channel detector. Extremely high-speed read channel chips are required to operate at data rates on the order of 3 GHz. Read channel chips for disk-drives that are used in portable lap-top computers and other battery-operated consumer electronics must be low-power. Since power usage increases with chip area and clock-speed, a good way to achieve low-power and high-throughput is to reduce the clock-rate and process more than one bit at a time with low-complexity signal processing that does not require significant area. Unfortunately, very complex area intensive signal processing is typically required to achieve the bit-error rate requirements for disk-drives.

The analog signal is filtered with an anti-aliasing filter and sampled so that there is one sample per bit. Because the bits are packed very tightly to achieve high storage capacity on the magnetic disk, the received samples have a low signal-to-noise ratio and are typically corrupted by inter-symbol-interference. The channel detector unravels the inter-symbol-interference by representing each possible combination of binary interfering symbols as states in a trellis. Typically, a 16-state trellis with four inter-symbol-interference symbols is required to provide sufficient performance in the channel detector. The area and power of the channel detector increase with the number of states in the trellis.

The binary sequences stored on the disk-drive are typically encoded with parity codes or error-correction codes that require soft-decisions from the channel detector to decode the sequence with sufficiently low error-rates. There are two main types of soft-output channel detectors. The most common type is a SOYA detector that uses a soft-output Viterbi algorithm (SOVA) to find the path through the trellis with the maximum probability given the received samples, and to calculate a soft-output for each bit along the path. A SOVA detector typically uses a forward state processor, a path memory, and a soft-output processor. Improved performance can be obtained by a maximum-a-posteriori (MAP) detector that uses a forward state processor, a backward state processor, and a soft-output processor. Since the backward state processor makes the MAP detector more complex than a SOVA detector, MAP detectors are not typically used. MAP detectors only provide small performance improvements over SOVA detectors and typically require larger chip area and more power. A MAP detector determines which binary value at each bit position has the maximum probability given the received samples, $\underline{y}$. For each bit, a MAP detector calculates a log-likelihood ratio, which is the conditional probability that $c_k$ is equal to binary zero (0) divided by the conditional probability that $c_k$ is equal to binary one (1), given the received samples, as follows:

$$Pr(c_k=0|\underline{y})/Pr(c_k=1|\underline{y}).$$

In a Log-MAP detector, the soft-decision is the natural log of the likelihood ratio, and the hard-decision is the sign of the soft-decision. In a Max-Log-Map detector, the soft-decision is the natural log of the probability associated with the maximum probability path with $c_k=0$ minus the natural log of the probability associated with the maximum probability path with $c_k=1$. The Max-Log Map algorithm is a simplification of the Log-Map algorithm, and the difference in performance is typically small.

A MAP detector comprises a forward detector, a current branch metric detector, and a backward detector. A full-rate forward detector calculates forward state metrics leading to each of the states at time k−1. In most conventional designs, the backward detector calculates backward state metrics starting from a single state with state metric 0 at time k+Q (where Q is the backward detection period) and leading to each of the states at time k, in the backward direction. Another approach is to let all the states at time k+Q have state metrics equal to 0. In a full-rate MAP detector, the current branch step represents the state transitions from time k−1 to time k. In conventional designs, the number of states at time k and k−1 are typically the same. The current bit label $c_k$ is the bit for which the detector is currently calculating a sort-output. The soft-output at time k is generated from combined metrics that are calculated by adding together a forward state metric, a backward state metric and a current branch metric.

In order to keep up with the throughput of emerging magnetic disk drives, a need exists for a high-speed, low-power, high-performance soft-output channel detector. A MAP detector that is smaller than a SOYA detector when implemented at very high-speed, and has better performance is the ideal solution.

SUMMARY OF THE INVENTION

Generally, methods and apparatus are provided for high-speed, low-power, high-performance channel detection. According to one aspect of the invention, a soft-output detector is provided for processing a received signal, comprising: a forward detector for calculating forward state metrics; a backward detector for calculating backward state metrics; and a current branch detector for calculating a current branch metric, wherein at least two of the forward detector, the backward detector and the current branch detector employ trellis structures with a different number of states.

According to another aspect of the invention, a method is provided for processing a received signal using a soft-output detector, comprising: calculating forward state metrics using a forward detector; calculating backward state metrics using a backward detector; and calculating a current branch metric using a current branch detector, wherein at least two of the forward detector, the backward detector and the current branch detector employ trellis structures with a different number of states.

A more complete understanding of the present invention, as well as further features and advantages of the present invention, will be obtained by reference to the following detailed description and drawings.

DETAILED DESCRIPTION

Figure 1:
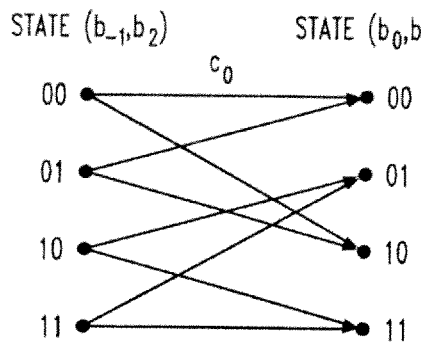
FIG. 1 illustrates a lull rate trellis and a quarter-rate trellis.
Figure 1:
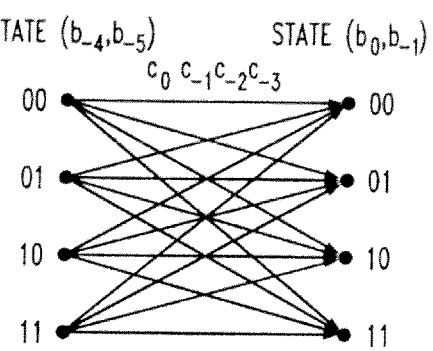

The present invention provides a high-speed, low-power, high-performance channel detector. According to one aspect of the invention, a channel detector is provided that comprises one or more MAP detectors operating in parallel. In the exemplary MAP detectors, the number of bits on a branch is larger than the number of bits in the state. The bits that are not constrained by a state are either selected based on local feedback or selected to minimize the path metric. When a bit is not constrained, the detector trellis structure does not guarantee that there will be both a surviving path with a 1 and a surviving path with a 0 at that time. Therefore, the detector may not be able to calculate a soft-output for that bit. In addition, assuming that 0 is the value on the minimum metric path, if there is a surviving path with a 1 in that position, there is no guarantee that it will be the minimum metric path with a 1. Therefore, the magnitude of the soft-output generated for a bit that is not constrained may be too large. Furthermore, a NP FIR filter may not be able to adapt that bit properly.

In the exemplary parallel MAP detectors, every bit is constrained in at least one of the MAP detectors. A bit is "detected" by a detector that has that bit constrained. The multiple instantiations of the MAP detector are shifted in time so that all the bits are constrained in at least one of the MAP detectors. Each MAP detector calculates soft-outputs for a subset of the bits that are constrained in the detector trellis. Then, the output from all the detectors is merged to form the output sequence.

In one exemplary embodiment, two parallel 4-state MAP detectors are employed at quarter-rate. Each of the parallel detectors generates two soft-outputs per quarter-rate clock cycle, so there are four soft-outputs generated per quarter-rate clock cycle. Each branch represents four bits, and each state represents two bits. An even MAP detector ties down two out of four possible bits, such as bits 0 and 1. An odd detector ties down the remaining two bits, such as bits 2 and 3. The even and odd notation applies when looking at the quarter-rate clock cycle, which is high for the first two bits and low for the last two bits in a 4-bit clock cycle. The even and odd MAP detectors determine the bit values and soft-outputs for the bits that are constrained by the respective detector.

In another aspect of the present invention, a sing e MAP detector is employed, where the forward and backward detectors within the MAP detector may use different trellis structures with some bits not constrained, but each bit used to calculate the label on the current branch is constrained. The current bit label $c_k$ is the bit for which the detector is currently calculating a soft-output, and the current branch is the branch that contains that bit label. In one exemplary embodiment, a single MAP detector operates at quarter-rate with four bits represented on each branch, and the forward detector uses a four state trellis, the backward detector uses a 4 or 8 state trellis, and all possible 4-bit current branches are constrained in the combined trellis structure. Four soft-outputs are generated for the 4 bit labels on the current branch.

Channel detectors are often implemented at a half rate using, a radix-4 trellis, i.e., there are two bits per branch and four incoming branches for each state. For each state, the state metric is added to four branch metrics to obtain four outgoing path metrics. The four incoming path metrics are compared using six comparators in parallel. A half-rate SOVA is typically smaller than a half-rate MAP detector. However, at quarter-rate, all the known prior implementations of SOVA and MAP detectors with good performance are typically too large to consider for a high-speed, low-cost channel detector. The present invention significantly reduces the complexity of a quarter-rate MAP detector, and increases the speed so that it is close to double that for a half-rate implementation.

FIG. 1 illustrates a full rate trellis 110 and a quarter-rate trellis 120. Each state in the quarter-rate trellis 120 has 16 incoming branches, which reduce to four branches after comparing and selecting the best of the parallel branch metrics. The branch label $c_0$ for the full-rate transition from state $[b_{-1}b_{-2}]$ to state $[b_0b_{-1}]$ is usually given by $c_0=b_0$, but may be different if there is precoding. For instance, a 1/(1⊕D) precoder causes the branch label to be $c_0=b_0 \oplus b_{-1}$, since the detector performs a (1⊕D) operation to undo the precoding.

The branch label $(c_0,c_{-1},c_{-2},c_{-3})$ for the quarter-rate transition from state $[b_{-4}b_{-5}]$ to state $[b_0b_{-1}]$ is usually given by $(c_0,c_{-1},c_{-2},c_{-3})=(b_0,b_{-1},b_{-2},b_{-3})$, but may be different if there is precoding. In a four state trellis, the bits $b_0$ and $b_{-1}$ are constrained by the state and the bits $b_{-2}$ and $b_{-3}$ are not.

Four-State Max-Log MAP Algorithm

Figure 2:
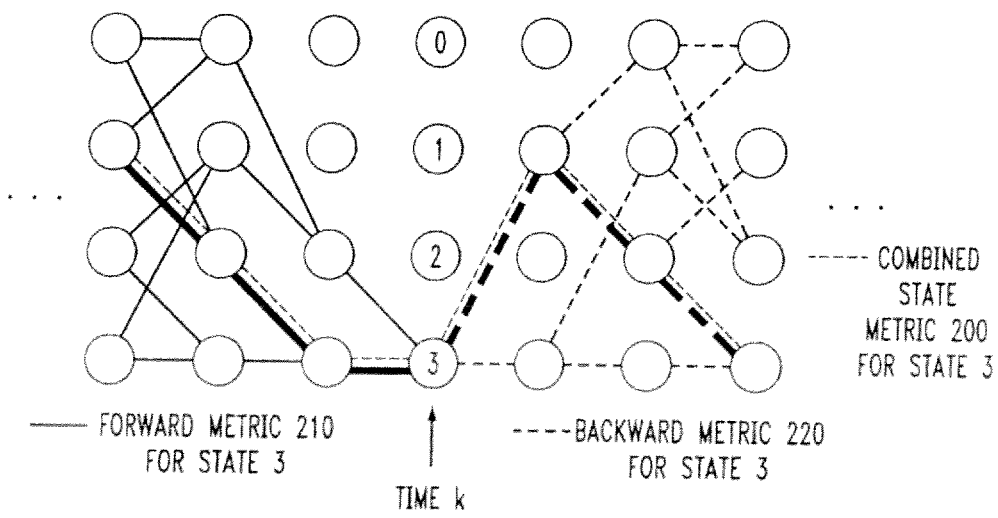
FIG. 2 illustrates the computation of a combined state metric for a best path through state 3 at time k, where the combined metric is given by the sum of a forward state metric and a backward state metric.

As previously indicated, a Max-Log-MAP detector combines forward and backward state metrics to calculate a soft-decision for each bit label. FIG. 2 illustrates the computation of a combined state metric 200 for the best path through state 3 at time k, where the combined metric 200 is given by the sum of the forward state metric 210 and backward state metric 220. In the notation of FIG. 2, the paths associated with the forward state metric 210 are shown as a solid line, the paths associated with the backward state metric 220 are shown as a line of dashed squares, and the paths associated with the combined state metric 200 are shown as a line of dashed circles. A Max-Log Map detector calculates the soft-decision for time k as the difference between the minimum combined metric with a 1 at time k and the minimum combined metric with a 0 at time k.

Figure 3:
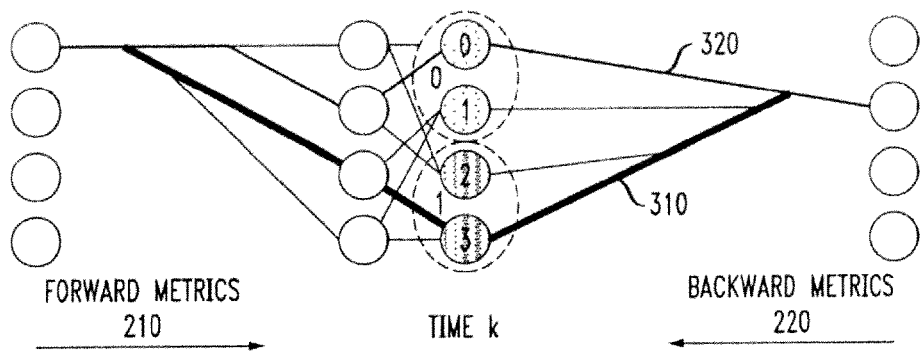
FIG. 3 illustrates the computation of the soft-decision for a bit at time k.

FIG. 3 illustrates the computation of the soft-decision for a bit at time k. As shown in FIG. 3, the soft-decision for a bit at time k is given as the difference between the combined metric 200 for the best path 310 with bit decision one (1) at time k and the combined metric 200 for the best path 320 with bit decision zero (0) at time k. For the 4-state trellis shown in FIG. 1, the soft-decision is given as the minimum of the combined metrics for states 2 and 3 less the minimum of the combined metrics for states 0 and 1.

In one exemplary embodiment of the Max-Log MAP algorithm, the branch metrics that are used to compute forward state metrics are delayed to compute metrics associated with backward processing in the forward direction. Such a Max-Log MAP detector computes combined metrics at time k+Q that correspond to the maximum probability path with bit label 0 at time k and the maximum probability path with bit label 1 at time k. In a Max-Log-MAP detector, the maximum probability path is the same as the minimum metric path. The difference between the two combined metrics is the soft-decision for the bit label at time k. The combined state metrics 200 represent the path metrics at time k+Q for the best paths going through each state at time k. For many applications, Q=8 is sufficient for good error rate performance. This look-ahead method eliminates the warm-up period typically associated with prior backward detectors. All the metrics that are calculated in the backward detector are accurate.

In this particular embodiment, the backward detector is approximately twice the size of the forward detector. The backward detector is implemented in the forward direction as if there are four independent forward detectors associated with each of the states at time k. The forward detector associated with state $S=[b_k b_{k-1}]$ with local feedback $F=b_{k-2}$ starts with state metrics $M_k(b_k b_{k-2})$ equal to 0 for $|b_k b_{k-1} b_{k-2}=[S, F]$ and equal to infinity for all the other states. The forward detector for state S finds the best path at time k+Q leaving state S at time k. There are 8 forward detectors in the backward detector, one for state S and local feedback F combination. If the number of bits on a branch is large, i.e., 4, the look-ahead length Q is small, i.e., 8, and the number of state and local feedback bits is small, i.e., 4 or 8, then the forward detectors associated with each state can be unraveled so that there are no state metrics that are fedback to generate new state metrics. Since there is no state metric feedback, the backward detector can be pipelined to achieve high-speeds and it does not have to use a single trellis structure to represent each trellis step. Each step can have a different number of states or local feedback.

With conventional designs, the number of bits on a branch is typically small, i.e., 1 or 2, and the number of states at time k is large, i.e., 16. When there are only 1 or 2 bits on each branch, the accurate backward detection period, Q, divided by the number of bits on a branch is large. For a half-rate 16-state MAP detector, there are 4 trellis branch steps associated with the look-ahead period Q=8. The size of an unraveled backward detector would be about 4 times the size of the forward detector. In contrast, the prior-art backward detector that warms-up from a single state is about the same size as the forward detector. When the backward detector uses the same branch metrics as the forward detector, the backward detector cannot use local feedback in the same way that the forward detector does. The local feedback needs to be treated as a state bit. Therefore, one local feedback bit doubles the number of states and two quadruples it. The easiest thing to do is to drop the local feedback and use a backward detector that has worse performance than the forward detector, but has the same number of states. In most conventional detectors, good performance requires 16 states with no local feedback, in which case the backward detector would be approximately the same size as the forward detector. Since conventional forward and backward detectors have the same speed and approximately the same size, there is no incentive to unravel the backward detector to make the backward detector faster and larger. However, the problem with conventional MAP and SOVA detectors is that at half-rate they are unable to achieve high data rates, and a much larger quarter-rate implementation is required.

Figure 4:
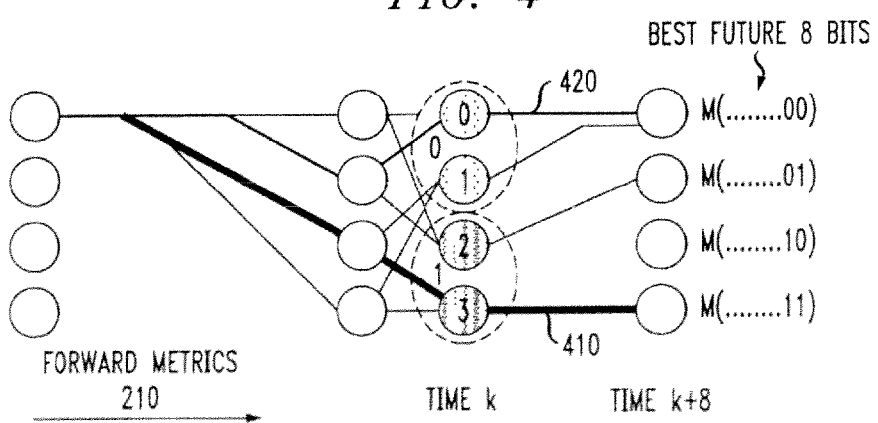
FIG. 4 illustrates the computation of combined state metrics at time k+8 for the best paths going through each particular state at time k.

FIG. 4 illustrates the computation of combined state metrics at time k+8 for the best paths 410, 420 going through each particular state at time k. In order to compute the soft-decision of FIG. 4, conventional techniques employ a 16 state detector with 16 in-bound paths and 16 out-bound paths for each state. The present invention recognizes that substantially similar performance can be obtained using a fewer number of states. In particular, one embodiment of the present invention uses one or more detectors operating in parallel that process four states at high speed in the forward detector, and four or more states in the backward detector The forward detector has a state metric that is calculated in one quarter-rate clock cycle and feedback for use in the next quarter-rate cycle. An exemplary disclosed MAP detector operates at quarter rate considering a 4-state trellis 120 with four branches entering each state and four bits per branch as shown in FIG. 1. Preliminary decisions are obtained with typical tracking latency.

The disclosed MAP detector uses only a 4-state trellis in the forward detector, but achieves performance similar to a 16-state detector by using two local feedback taps for the computation of branch metrics. However, in one exemplary implementation, the MAP detector minimizes one local feedback tap out, so that only one local feedback tap is required. It has been found that this branch metric computation technique achieves nearly the same performance as the one with two local feedback taps.

As discussed hereinafter, an exemplary MAP detector implements two 4-state modified Max-Log Map detectors that are offset by two bits to generate 4 log-likelihood ratios (LLRs) per quarter-rate cycle. The branch metric input to the odd phase detector is delayed by two from the even phase detector. The even phase detector computes LLR values (and preliminary decisions) for bits $b_0 b_1$ $b_4 b_5$ $b_8 b_9$ .... The odd phase detector calculates LLR values for bits $b_2 b_3$ $b_6 b_7$ $b_{10} b_{11}$....

In a 16-state trellis, each state has four bits. When using a four state trellis to approximate the performance of a 16-state trellis, two bits are obtained from the state label, and two bits are obtained from local feedback to select the branch metrics. Each state has 16 incoming branches, which reduce to four branches after comparing and selecting the best of the parallel branch metrics. The exemplary feedback loop contains an adder to add the state metric to the current branch metric, a 4-way compare and a 4-way select. The exemplary embodiment calculates two sets or 256 (for a total of 512) quarter-rate branch metrics. The branch metrics in the even phase detector can be expressed as $BM_0(b_0 b_{-1} b_{-2} b_{-3} [b_{-4} b_{-5} b_{-6} b_{-7}])$ and the branch metrics in the odd phase detector can be expressed as $BM_{-2}(b_{-2} b_{-3} b_{-4} b_{-5} [b_{-6} b_{-7} b_{-8} b_{-9}])$. In one variation, only 256 quarter-rate branch metrics are calculated, reducing the complexity and increasing the speed, by removing the dependence on the last bit ($b_{-7}$ and $b_{-9}$, respectively). As discussed hereinafter, the dependence on the last bit is removed by selecting the branch metric with the minimum value for either binary 0 or 1 in the respective position.

Figure 5:
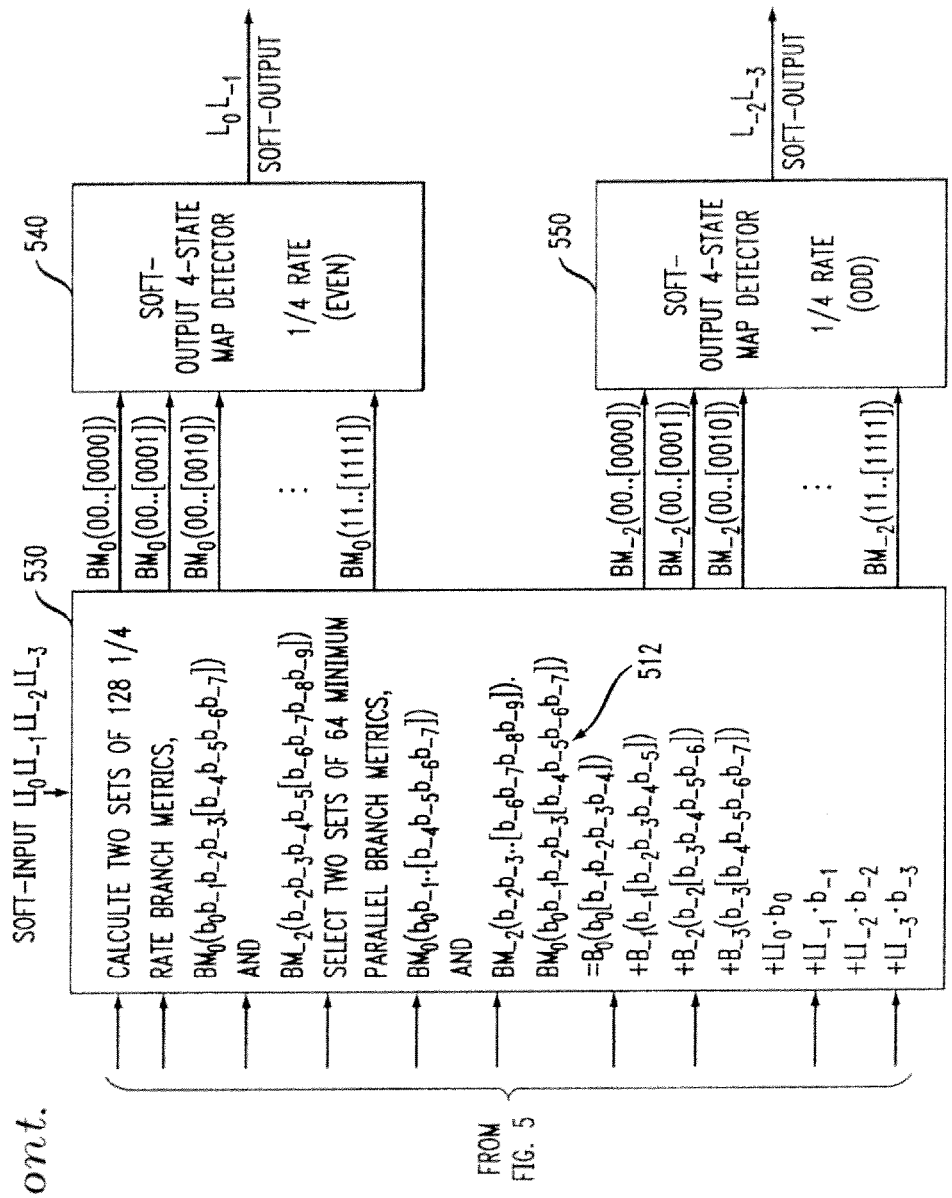
FIG. 5 is a schematic block diagram of a soft input-soft output channel detector incorporating features of the present invention.

FIG. 5 is a schematic block diagram of a soft input-soft output channel detector 500 incorporating features of the present invention. As shown in FIG. 5, the soft input-soft output channel detector 500 processes the equalized samples $y_0 y_{-1} y_{-2} y_{-3}$ to calculate the four log-likelihood ratios $L_0 L_{-1} L_{-2} L_{-3}$. The soft input-soft output channel detector 500 comprises a signal dependent noise predictive (SDP) quarter rate FIR filter 510. The waveform read back from the disk is sampled once per bit and equalized with an FIR filter to a partial response target Since the noise associated with an equalized sample $y_0$ is signal-dependent, a set of 32 signal-dependent noise predictive (SDNP) FIR filters 510 are used to generate 32 different filter values $z_0(b_0 b_{-1} b_{-2} b_{-3} b_{-4})$, one for each 5-bit signal dependent condition. Typically, a reduced set of signal-dependent conditions are used to reduce complexity. When operating at quarter-rate, the 32 different filtered values for each time interval $t_0$ through $t_{-3}$, such as $z_0(b_0 b_{-1} b_{-2} b_{-3} b_{-4})$ for time $t_0$, together with a mean value for the associated filtered value, are then applied to a respective square-difference operator at stage 520.

Generally, the output of stage 520 is the four sets of 32 full rate branch metrics when operating at quarter rate, $B_0(b_0[b_{-1} b_{-2} b_{-3} b_{-4}])$, $B_{-1}(b_{-1}[b_{-2} b_{-3} b_{-4} b_{-5}])$, $B_{-2}(b_{-2}[b_{-3} b_{-43} b_{-54} b_{-65}])$, and $B_{-3}(b_{-3}[b_{-4} b_{-5} b_{-6} b_{-7}])$. The output of the 32 square difference operators associated with time $t_0$ are squared error values, $sqn_0(b_0 b_{-1} b_{-2} b_{-4} b_{-4})$. For the correct path, the squared error represents the squared noise associated with equalized sample $y_0$. For incorrect paths, the squared error includes both a noise and a signal component. The square difference operator 520 computes the squared noise value $sqn_0(b_0 b_{-1} b_{-2} b_{-3} b_{-4})$ as follows:

$$sqn_0(b_0[b_{-1} b_{-2} b_{-3} b_{-4}]) = (z_0(b_0 b_{-1} b_{-2} b_{-3} b_{-4}) - \text{mean}(b_0 b_{-1} b_{-2} b_{-3} b_{-4}))^2.$$

where $\text{mean}(b_0 b_{-1} b_{-2} b_{-3} b_{-4})$ represents the average value of $z_0(b_0 b_{-1} b_{-2} b_{-3} b_{-4})$ given that $b_0 b_{-1} b_{-2} b_{-3} b_{-4}$ is the correct path. The value of $\text{mean}(b_0 b_{-1} b_{-2} b_{-3} b_{-4})$ is computed by adding the ideal (noise-less) output for the effective equalization target (combination of the FIR target and the SDNP FIR filter), $\text{ideal}(b_0 b_{-1} b_{-2} b_{-3} b_{-4})$, and a bias value, $\text{bias}(b_{-1} b_{-2} b_{-3} b_{-4})$, that corresponds to the average error between $z_0(b_0 b_{-1} b_{-2} b_{-3} b_{-4})$ and $\text{ideal}(b_0 b_{-1} b_{-2} b_{-3} b_{-4})$ when $b_0 b_{-1} b_{-2} b_{-3} b_{-4}$ is the correct path, $$\text{mean}(b_0 b_{-1} b_{-2} b_{-3} b_{-4}) = \text{ideal}(b_0 b_{-1} b_{-2} b_{-3} b_{-4}) + \text{bias}(b_0 b_{-1} b_{-2} b_{-3}).$$

In a soft-input/soft-output detector, the soft-input $LI_0$ is added to the squared error to form the full-rate branch metric, according to:

$$B_0(b_0 b_{-1} b_{-2} b_{-3} b_{-4}) = sqn_0(b_0 b_{-1} b_{-2} b_{-3} b_{-4}) \text{ if } c_0 = b_0 = 0$$

$$sqn_0(b_0 b_{-1} b_{-2} b_{-3} b_{-4}) + LI_0 \text{ if } c_0 = b_0 = 1.$$

The 128 full rate branch metrics, B, are applied to a branch metric unit 530 that calculates 512 quarter rate branch metrics, BM, from the 128 full-rate branch metrics and 64 delayed full-rate branch metrics, according to the equation shown within element 530. As used herein, in the notation $BM_0(\underline{0000}[0000])$, the underlined leading zeroes indicate the sum of four full rate branch metrics for times $t_0, t_{-1}, t_{-2}, t_{-3}$, respectively. As shown in FIG. 5, the minimum of the four parallel branches $BM_0 (b_0 b_{-1} \ldots [b_{-4} b_{-5} b_{-6} b_{-7}])$ 500 is selected and applied to the soft output four-state MAP detectors 540, even detector. Similarly, the minimum of the four parallel branches $BM_{-2}(b_{-2} b_{-3} \ldots [b_{-6} b_{-7} b_{-8} b_{-9}])$ 500 is selected and applied to the soft output four-state MAP detectors 550, odd detector. The soft-output Map detectors 540, 550 generate the log-likelihood ratios, L, as discussed further below in conjunction with FIG. 7.

Figure 6:
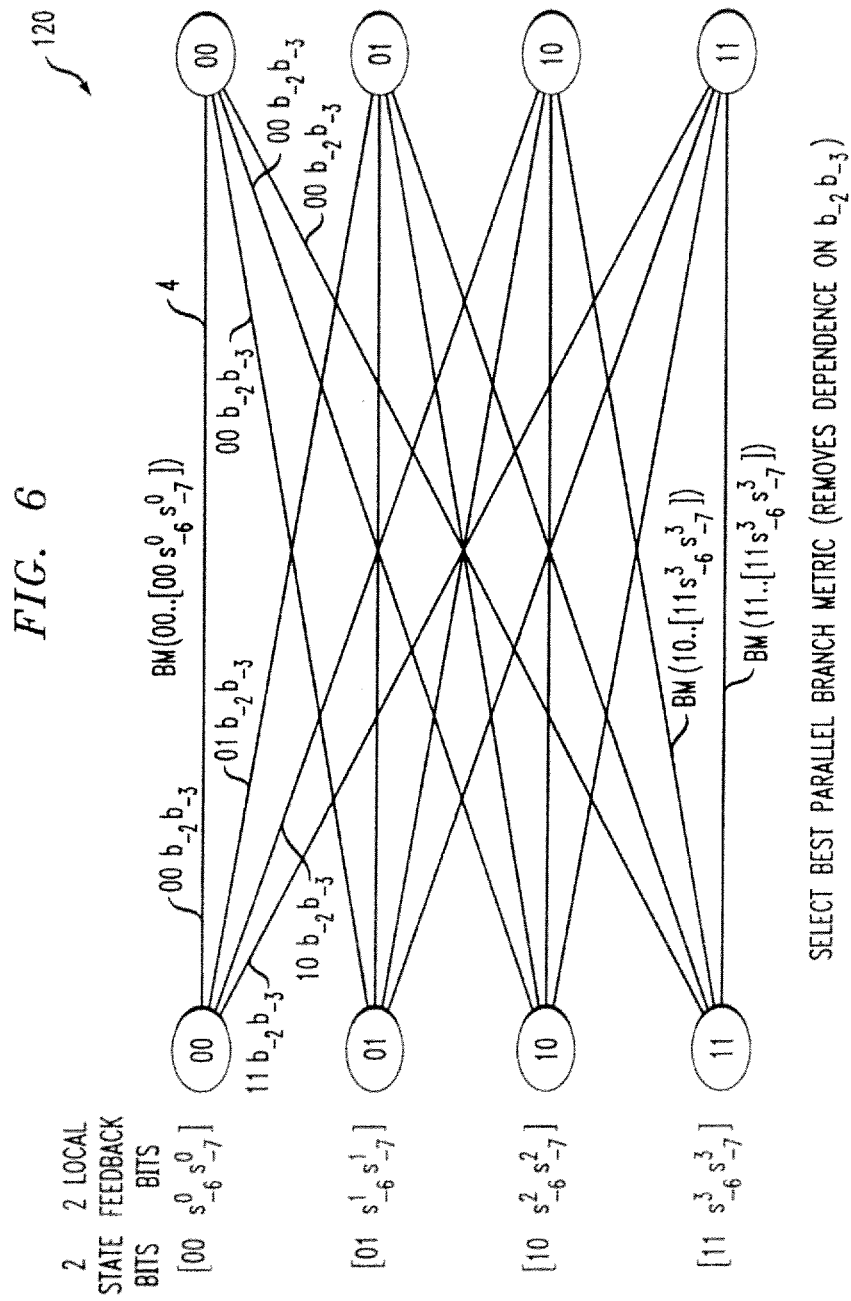
FIG. 6 illustrates the exemplary quarter-rate trellis of FIG. 1 in further detail.

FIG. 6 illustrates the exemplary quarter-rate trellis 120 of FIG. 1 in further detail. It is again noted that the exemplary quarter-rate trellis 120 is a four state trellis, with four sets of four branches into each state, and each branch having four bits. There are thus 16 paths entering each state (4 sets of 4 parallel paths). The parallel branch metrics for each feedback condition are compared and the minimum parallel branch metric is selected that matches the local feedback. The trellis 120 thus reduces to only four incoming paths. In this manner, the critical path is (a 4-way select feedback)/an add/(a 4-way compare)/(a 4-way select) in one quarter rate clock cycle.

As shown in FIG. 6, the state label associated with each state, such as the state label of the first state $[00 \; s^0_{-6} s^0_{-7}]$, comprises two state bits and two local feedback bits. The two local feedback bits are determined by the best path leading to the respective state. The first local feedback bit, for example, $s^0_{-6}$ indicates the bit on the surviving path leading to state 0 at time $t_{-6}$. As discussed further below, one embodiment of the present invention optionally reduces the complexity by removing the second local feedback bit by minimizing it out.

The four bit labels leaving each state, such as $00 b_{-2} b_{-3}$, comprise two bits indicating the new state (first two bits) and then two bits that are not constrained by the state (therefore, there are four possible state values). In addition, the branch metric representing the minimum branch metric of the four parallel branches, is denoted by $$BM_0(00 \ldots [00 s^0_{-6} s^0_{-7}]) = \min_{\{BM0\}}(0000[00 s^0_{-6} s^0_{-7}], BM_0(0001[00 s^0_{-6} s^0_{-7}], BM_0(0010[00 s^0_{-6} s^0_{-7}], BM_0(0011[00 s^0_{-6} s^0_{-7}]\}.$$

The best parallel path (minimum value) is selected to remove the dependency on bits $b_{-2}, b_{-3}$. The four bits inside the square brackets represent the historical information of the prior state and local feedback.

Figure 7:
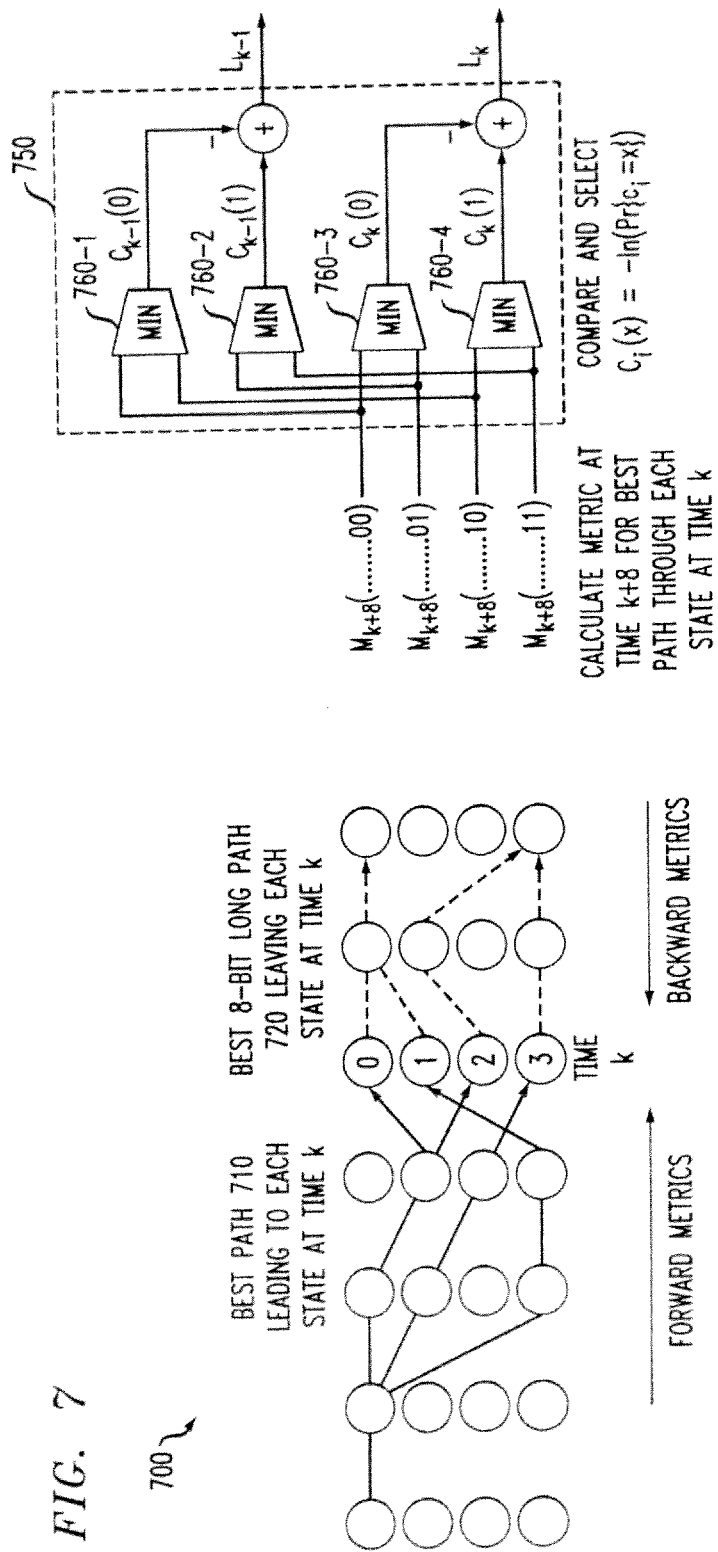
FIG. 7 illustrates a trellis with the best paths (solid lines) leading into each state at time k, and with the best paths (dashed lines) leaving each state at time k (backward processing in the exemplary embodiment is 8-bits long)

FIG. 7 illustrates a trellis 700 with the best paths 710 (solid lines) leading into each state at time k and with the best paths 720 (dashed lines) leaving each state at time k (backward processing in the exemplary embodiment is 8-bits long). In addition, FIG. 7 illustrates a MAP detector 750 incorporating features of the present invention. The MAP detector 750 processes metrics, $M_{k+8}$, at time k+8 for the best path through each state at time k. Generally, as discussed further below in conjunction with FIG. 8 for a reduced complexity implementation, the metrics, $M_{k+8}$, are the minimum of the sum of all quarter rate branch metrics, BM, on the best path having the minimum path metric, through state k and going up to time k+8. In the notation of FIG. 7, the first metric $M_k(\ldots 00)$ represents the negative, natural log of the probability of 0 at time k and 0 at k−1, $-\ln\{Pr(b_k=0 \text{ and } b_{k-1}=0)\}$, where the branch label $c_i=b_i$, for all the exemplary embodiments. The leading dots indicate the binary values k+8 through k+1 that are minimized over to obtain the best path and the trailing zeroes indicate the values for k and k−1 that are constrained.

Comparators 760-1 through 760-4 select the minimum metric. Comparator 760-1 selects the best path having a value of 0 at time k−1. Comparator 760-2 selects the best path having a value of 1 at time k−1. Comparator 760-3 selects the best path having a value of 0 at time k. Comparator 760-4 selects the best path having a value of 1 at time k. Each comparator 760-1 through 760-4 selects, $C_i(x)$, equal to $-\ln(Pr\{b_i=x\})$. The soft-output of the MAP detector 750 represents the log-likelihood ratio $L_i$ equal to $\ln(Pr\{b_i=0\}/Pr\{b_i=1\})$.

According to one aspect of the invention, the backward processing is unfolded and combined with the forward processing so that both share the same branch metric computations. Backward processing is implemented as a look-ahead to find the best path leaving the state. While the exemplary MAP detector 750 is illustrated as a max-log MAP detector, any type of MAP algorithm can be implemented, as would be apparent to a person of ordinary skill in the art.

Reduced Complexity Approach

In a variation of the present invention, complexity is reduced and speed is increased by feeding back only one of the two local feedback bits, and minimizing out the dependence on the other bit. As used herein, "reduced complexity" means the dependence on the oldest bit (h) is removed by selecting the value of h that minimizes the oldest full-rate branch metric, as follows:

$$BM_0(b_0 b_{-1} b_{-2} b_{-3} [b_{-4} b_{-5} b_{-6}.])$$

where the dependence on bit $b_{-7}$ has been minimized out. The minimum value is selected, with a trade off in reduced complexity at the expense of some lost performance. The complexity of the branch metric calculation block is reduced in half. Thus, only 256 quarter-rate branch metrics are pre-calculated at stage 530 of FIG. 5, as follows:

$$BM_0(b_0 b_{-1} b_{-2} b_{-3} [b_{-4} b_{-5} b_{-6}.]) \text{ and } BM_{-2}(b_{-2} b_{-3} b_{-4} b_{-5} [b_{-6} b_{-7} b_{-8}.])$$

Now, when the parallel branch metrics for each feedback condition are compared and the minimum parallel branch metric is selected that matches the local feedback, there are only 64 compare/selections to get:

$$BM_0(b_0 b_{-1} \ldots [b_{-4} b_{-5} b_{-6}.]) \text{ and } BM_{-2}(b_{-2} b_{-3} \ldots [b_{-6} b_{-7} b_{-8}.])$$

Finally, the 32 quarter-rate branch metrics (16 to each of the even and odd MAP detectors 750) are selected to feed to the channel detector, as follows:

$$BM_0(b_0 b_{-1} \ldots [b_{-4} b_{-5} \ldots]) =$$

$$BM_0(b_0 b_{-1} \ldots [b_{-4} b_{-5} 1.]) \text{ if } s^{b_{-4} b_{-5}}_{-6} = 1$$

$$BM_0(b_0 b_{-1} \ldots [b_{-4} b_{-5} 0.]) \text{ if } s^{b_{-4} b_{-5}}_{-6} = 0$$

and $$BM_{-2}(b_{-2} b_{-3} \ldots [b_{-6} b_{-7} \ldots]) =$$

$$BM_{-2}(b_{-2} b_{-3} \ldots [b_{-6} b_{-7} 1.]) \text{ if } s^{b_{-6} b_{-7}}_{-8} = 1$$

$$BM_{-2}(b_{-2} b_{-3} \ldots [b_{-6} b_{-7} 0.]) \text{ if } s^{b_{-6} b_{-7}}_{-8} = 0.$$

$BM_0(b_0 b_{-1} \ldots [b_{-4} b_{-5} \ldots])$ indicates the branch metric associated with a transition from state at time −4 to the state at time 0 that is added to the state metric $M(b_{-4} b_{-5})$. The selection signal, s, controls a corresponding multiplexer as discussed further below in conjunction with FIG. 8. For example, if the selection signal, $s_{-6}$, is a binary one (1), the multiplexer will select the value of 1 in bit position $b_{-6}$, and if the selection signal, $s_{-6}$, is a binary zero (0), the multiplexer will select the value of 0 in bit position $b_{-6}$.

Figure 8:
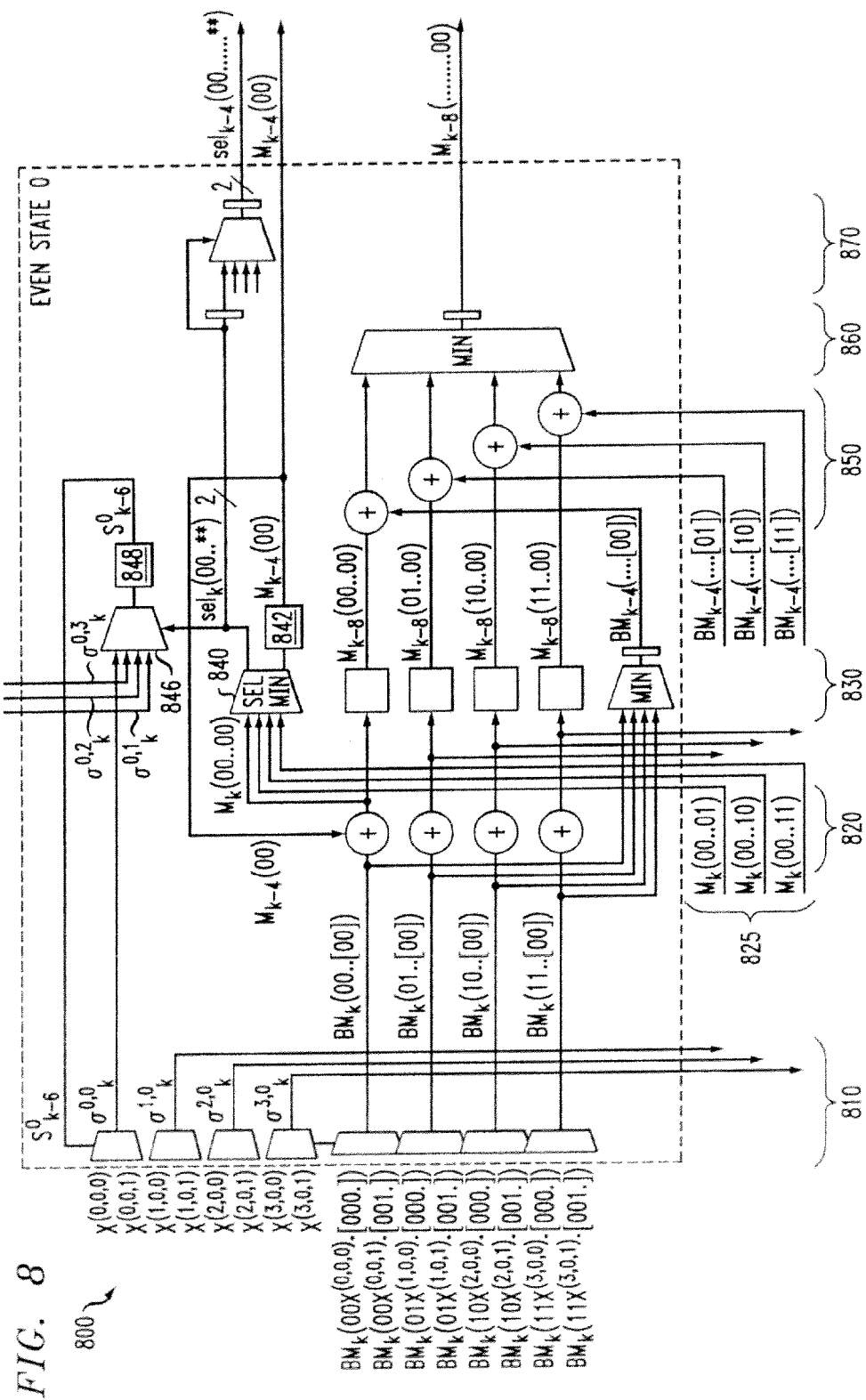
FIG. 8 is a schematic block diagram of an add-compare select-look ahead block 800 for an exemplary state 0 in the even detector of FIG. 5.

FIG. 8 is a schematic block diagram of an add-compare select-look ahead block 800 for an exemplary state 0 in the even detector 540 of FIG. 5. Since there are four states in each of the exemplary even and odd detectors 540, 550, there are a total of eight blocks 800. The four upper multiplexers at stage 810 are controlled by the local feedback selection signal, $s^0_{k-6}$ representing the third most recent bit on the survivor path leading to state 0 at time k−4, also denoted $s^S_{Ik-6} = Sel_{k-6}(b_{k-4} b_{k-5})$ for initial state $S_1 = [b_{k-4} b_{k-5}]$. The output of the multiplexer is the third most recent bit on the best path connecting state $[b_{k-4} b_{k-5}] = 0$ with a future state $S_F = [b_k b_{k-1}]$, $\sigma^{S} F^0_k = Sel_{k-6}(b_{k-4} b_{k-5} \ldots b_{k-4} b_{k-5})$. The input to the multiplexer is the third most recent bit on the best path connecting state 0 with a future state that is also constrained to have a specified feedback bit value $F = b_{k-6}, X^{(S_F, S_F)} = Sel_{k-2}(b_k b_{k-1} \ldots b_{k-4} b_{k-5} b_{k-6})$.

As previously indicated, the four lower multiplexers at stage 810 are controlled by selection signal, $s^0_{k-6}$, to select one of the branch metrics having the appropriate value in the k−6 position. The outputs of the four lower multiplexers at stage 810 are the four branch metrics leaving state 0. The adders at stage 820 add the four branch metrics leaving state 0 with $M_{k-4}(00)$, the best path leading up to state 0 at time k−4. The sums are the path metrics $M_k(00 \ldots 00)$. The additional path metrics 825 are calculated in other state blocks for branch metrics leaving states 1, 2, 3.

The path metrics $M_k(00 \ldots 00)$, $M_k(01 \ldots 00)$, $M_k(10 \ldots 00)$ and $M_k(11 \ldots 00)$ generated by the adders 820 are delayed at stage 830 by twice the 4T quarter rate to obtain the $M_{k-8}$ values for backwards processing. In this manner, the block 800 allows circuitry to be shared and reused by the forward and backward processing. In addition, a multiplexer at stage 830 compares the four branch metrics leaving state 0 and selects the best one (minimum value) to and then delay it by 4T to obtain $BM_{k-4}(\ldots [00])$, the best branch metric leaving state 0. It is noted that in the notation $BM_{k-4}(\ldots [00])$, the values inside the square brackets are tied down at times k−8 and k−9.

The adders at stage 850 add the values at times k−8 and k−9 which are tied down. In addition, the multiplexer 840 at stage 850 compares the four path metrics $M_k(00 \ldots 00)$, $M_k(01 \ldots 00)$, $M_k(10 \ldots 00)$ and $M_k(11 \ldots 00)$ entering state 0 (and generated by the adders 820) and selects the minimum value which is then delayed by 4T at delay 842 to generate the state metric $M_{k-4}(00)$. The selection signal $s^0_{k-6}$ is selected by multiplexer 846 under control of the selected state metric and delayed by 4T at delay 848. The minimum combined metric $M_{k-8}(\ldots 00)$ for state 0 through state 0 eight time periods ago (k−8) is selected by a multiplexer at stage 860 and then delayed by 4T. A selection signal for time k−4, $sel_{k-4}$, is generated by a delay and multiplexer stage 870.

Figure 9:
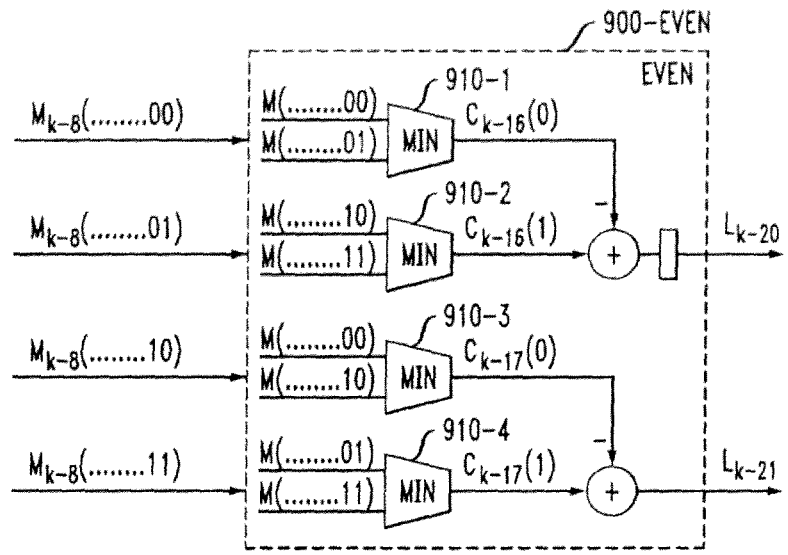
FIG. 9 illustrates even and odd circuits for generating the soft outputs (log-likelihood ratios)
Figure 9:
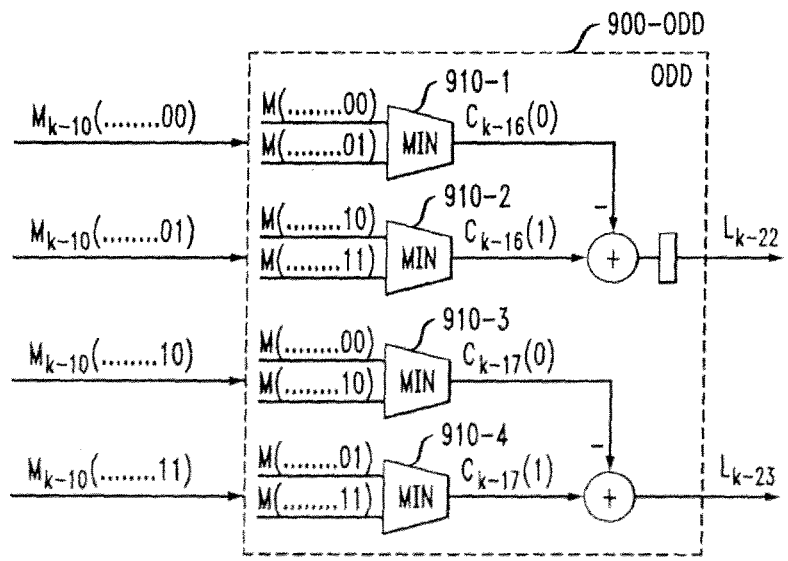

FIG. 9 illustrates even and odd circuits 900 for generating the soft outputs (log-likelihood ratios). As shown in FIG. 9, the first combined metric, $M_{k-8}(\ldots 00)$, is obtained from the detector 800 of FIG. 8 and the remaining seven combined metrics are obtained from similar detectors. Comparators 910-1 through 910-4 select the minimum metric. Comparator 910-1 selects the best path having a value of 0 at time k−16. Comparator 910-2 selects the best path having a value of 1 at time k−16. Comparator 910-3 selects the best path having a value of 0 at time k−17. Comparator 910-4 selects the best path having a value of 1 at time k−17. The output of the adders are then delayed by 4T to provide the log-likelihood ratios for time k−16.

Single Detector Approach

Another embodiment of the present invention involves a single MAP detector with three parts: a forward detector, a current branch metric, and a backward detector, where all three parts may have different trellis structures (i.e., different number of states and/or different local feedback). In this embodiment, the forward trellis and backward trellis structures do not constrain all the bits, and the current branch constrains all the current branch bits. In order to guarantee that the soft-output for the current branch labels is calculated accurately, the combination of the three parts constrains all the bits that are needed to calculate the labels on the current branch.

Figure 10:
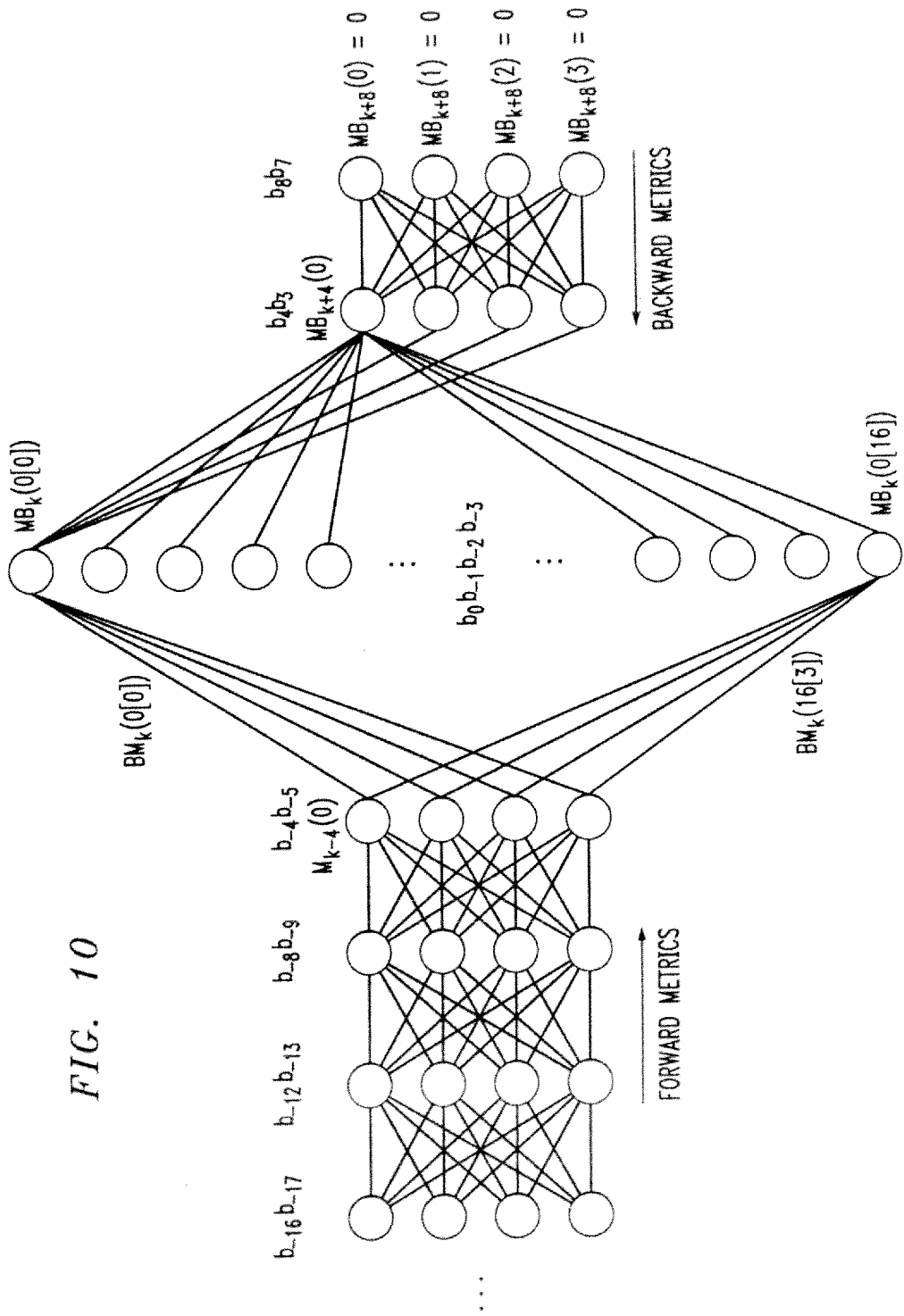
FIG. 10 shows the combined trellis structure associated with time k for a single quarter-rate MAP detector with four states in the forward and backward detectors and 16 states leaving the current branch.

FIG. 10 shows the combined trellis structure associated with time k for a single quarter-rate MAP detector with four states in the forward and backward detectors and 16 states leaving the current branch. FIG. 10 only attempts to show some of the branch connections associated with the 16 states at time k, which each have four incoming paths and four out-going paths. The states at time k+4 have 16 incoming paths and four out-going paths.

Figure 11:
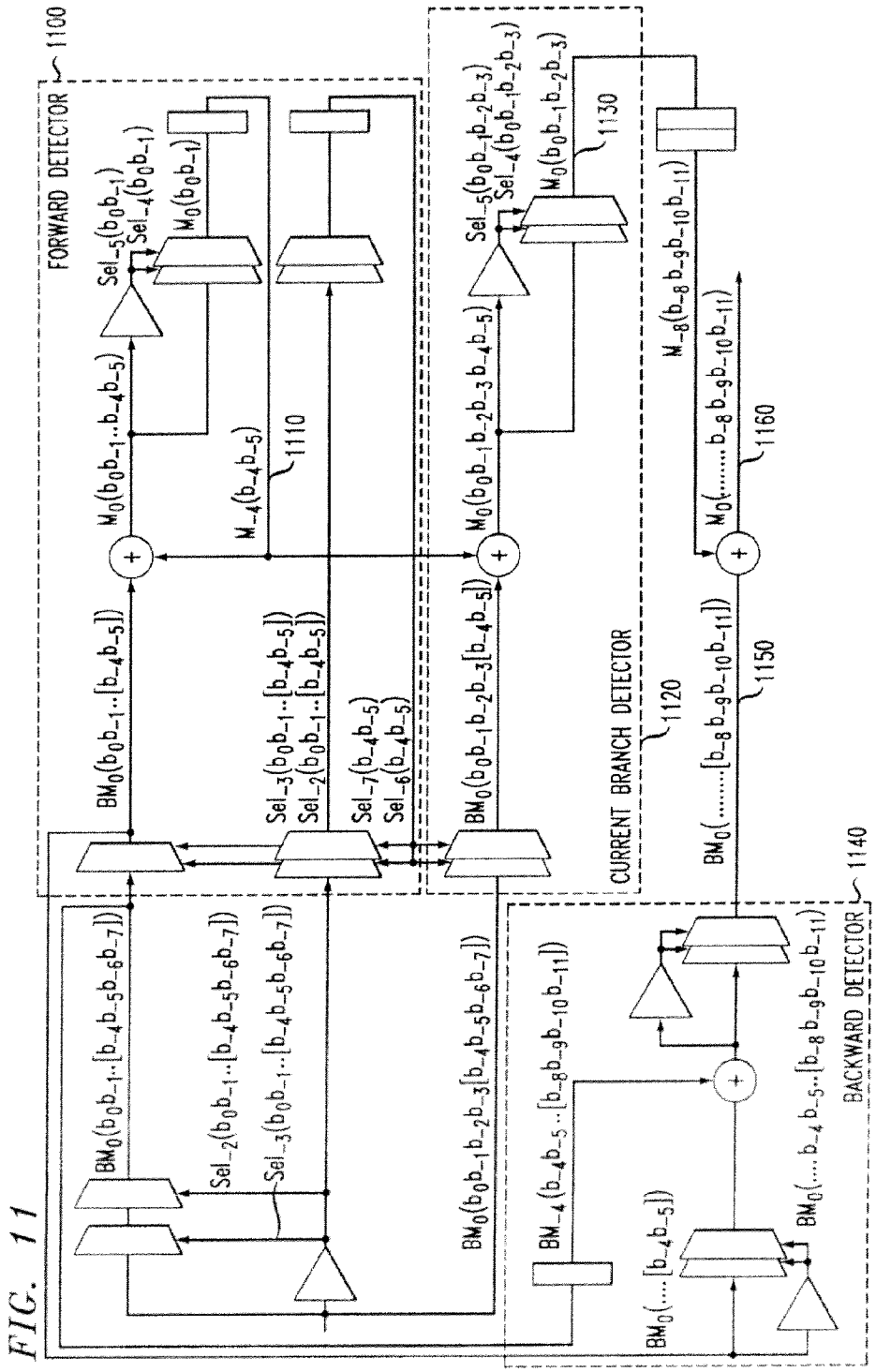
FIG. 11 describes an embodiment of a detector that uses the trellis structure in FIG. 10.

FIG. 11 describes an embodiment of a detector that uses the trellis structure in FIG. 10. There are 4 states with two local feedback bits in the forward detector. The forward detector 1100 updates four forward state metrics $M_k(b_k b_{k-1})$ 1110 by selecting the minimum of:

$$M_k(b_k b_{k-1} \ldots b_{k-4} b_{k-5}) = BM_k(b_k b_{k-1} \ldots [b_{k-4} b_{k-5} b_{k-6} b_{k-7}]) + M_{k-4}(b_{k-4} b_{k-5}),$$

where the local feedback is selected by the survivor paths in the forward detector, $b_{k-6} = Sel_{k-6}[b_{k-4} b_{k-5}]$ and $b_{k-7} = Sel_{k-7}[b_{k-4} b_{k-5}]$. There are four bits associated with the current branch and future state for the current branch ($b_k b_{k-1} b_{k-2} b_{k-3}$) and there are four bits associated with the initial state $[b_{k-4} b_{k-5}]$ and local feedback $[b_{k-6} b_{k-7}]$. The current branch detector 1120 adds the branch metric for the current branch, $BM_k(b_k b_{k-1} b_{k-2} b_{k-3} [b_{k-4} b_{k-5} b_{k-6} b_{k-7}])$ with selected local feedback $b_{k-6} = Sel_{k-6}[b_{k-4} b_{k-5}]$ and $b_{k-7} = Sel_{k-7}[b_{k-4} b_{k-5}]$, to the forward state metric $M_{k-k}(b_{k-4} b_{k-5})$ to generate a current metric $M_k(b_k b_{k-1} b_{k-2} b_{k-3})$ 1130. Ideally, there would be 8 or 16 states in the backward detector, due to the local feedback. However, in this particular embodiment, the backward detector has reduced performance and complexity. The backward detector has 4 states with no local feedback everywhere except on the state connected to the current branch, which has 4 state bits $[b_k b_{k-1} b_{k-2} b_{k-3}]$. The dependence on local feedback is removed by selecting the values that minimize the branch metrics. The backward detector 1140 calculates a look-ahead branch metric $B_k(\ldots [b_k b_{k-1} b_{k-2} b_{k-3}])$ 1150 that represents the best 8-bit branch leaving state $[b_k b_{k-1} b_{k-2} b_{k-3}]$. The look-ahead branch metric is calculated by selecting the minimum 4-bit look-ahead branch metric leaving state $[b_{k+4} b_{k+3}]$, adding it to the minimum branch metric associated with the transition from state $[b_k b_{k-1} b_{k-2} b_{k-3}]$ to state $[b_{k+4} b_{k+3}]$, and minimizing over the dependence on the connecting state bits:

$$B_k(\ldots [b_k b_{k-1} b_{k-2} b_{k-3}]) = \min \text{ over } b_{k+4} b_{k+3} \{B_{k+8} (\ldots [b_{k+4} b_{k+3}]) + B_{k+4}(b_{k+4} b_{k+3} \ldots [b_k b_{k-1} b_{k-2} b_{k-3}])\}.$$

Figure 12:
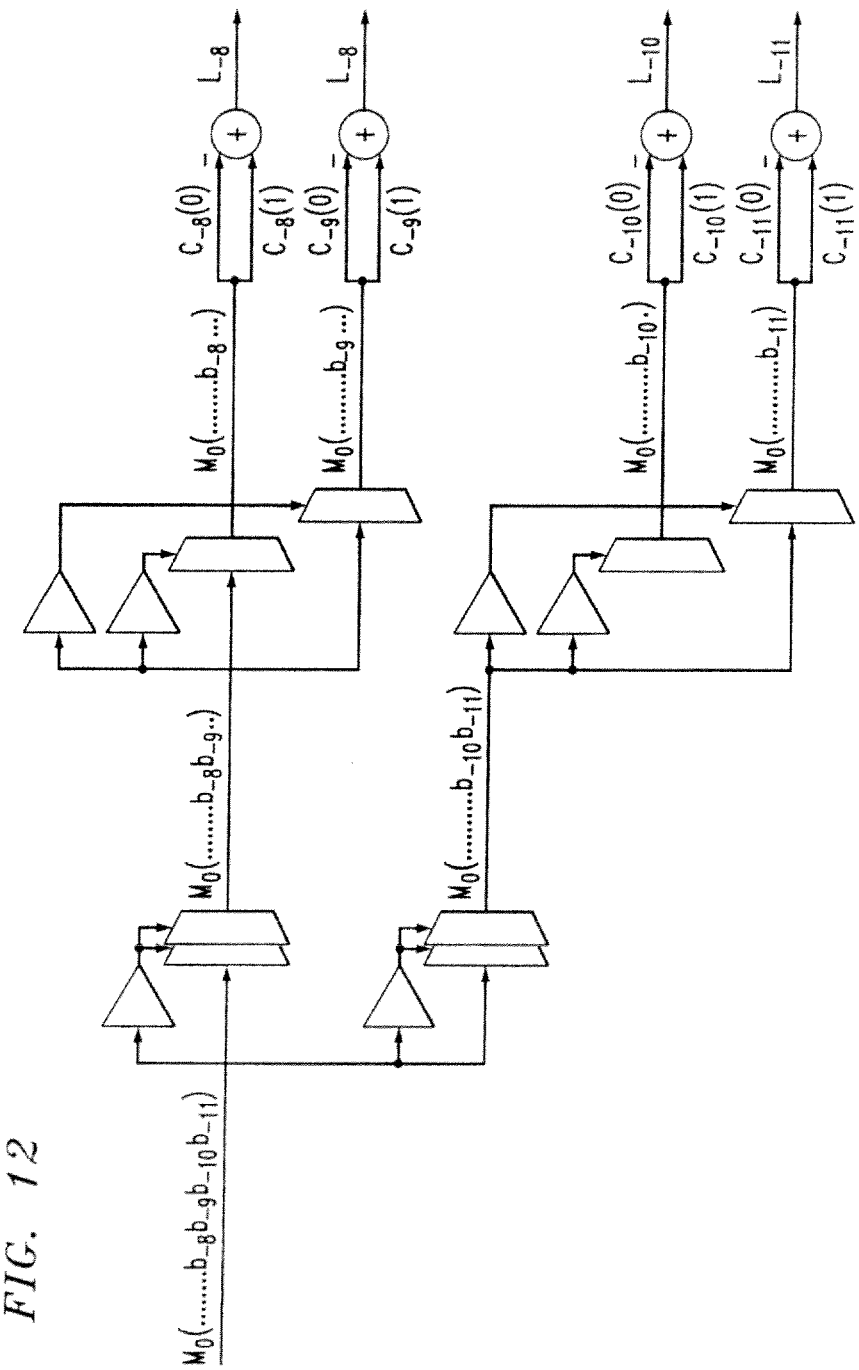
FIG. 12 illustrates the computation of the soft-outputs (log-likelihood ratios).

Then, the look-ahead branch metric is added to a delayed version of the current metric to obtain the combined metric $M_k(\ldots b_k b_{k-1} b_{k-2} b_{k-3})$ 1160. FIG. 12 shows how the combined metric is broken down into two metrics $M_k(\ldots b_k b_{k-1})$ and $M_k(\ldots b_{k-3} b_{k-4})$ as intermediate steps in calculating $C_i(x) = -\ln(Pr\{b_i = x\})$ and the soft-outputs $$L_i = \ln(Pr\{b_i = 1\}) - \ln(Pr\{b_i = 0\})$$

The single MAP detector embodiment may be a more flexible design than the parallel MAP detector embodiment for achieving higher performance with higher complexity, beyond the examples described in detail. However, storing all the quarter-rate branch metrics and the more complex combined metric make the single detector described by FIGS. 11 and 12 slightly larger than the two parallel MAP detectors described in FIGS. 8 and 9. The two detailed embodiments have similar performance.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A soft-output detector for processing a received signal, comprising:
  a forward detector for calculating forward state metrics;
  a backward detector for calculating backward state metrics; and
  a current branch detector for calculating a current branch metric, wherein at least two of said forward detector, said backward detector and said current branch detector employ trellis structures with a different maximum number of states.

2. The soft-output detector of claim 1, wherein said forward detector uses a four state, radix $2^N$ trellis with or without feedback, with $N \geq 2$, where N is a number of received samples.

3. The soft-output detector of claim 1, wherein said backward state metrics are unraveled by setting initial backward state metrics to 0 and calculating a best path leaving each current backward state in a forward direction.

4. The soft-output detector of claim 1, wherein forward branch metrics are used by said forward detector to calculate said forward state metrics and also used by said backward detector to calculate at least a portion of said backward state metrics, and wherein the soft-output detector further comprises one or more registers for delaying said forward state metrics.

5. The soft-output detector of claim 1, wherein each backward state metric represents a best path of length Q leaving a current backward state in a forward direction, where Q is one of N and 2N, and wherein the forward detector uses a radix $2^N$ trellis with $N \geq 2$, where N is a number of received samples.

6. The soft-output detector of claim 1, wherein log-likelihood ratios are calculated for a symbol using a combined trellis structure that contains all possible values of the symbol, wherein a combined metric for each possible symbol value is calculated by adding a forward state metric, a current branch metric, and a backward state metric and wherein a dependence on parts of the backward state label, current branch label, and forward state label is removed that do not directly map to the symbol value, wherein a hard-decision is the symbol value associated with the best combined metric in a set of combined metrics for all possible symbol values, wherein a magnitude of the log-likelihood ratio for each possible symbol value is obtained by substantially taking a difference between a best combined metric associated with that particular symbol value and a best combined metric in said set of combined metrics for all possible values.

7. The soft-output detector of claim 1, wherein one or more of a max-log-MAP algorithm, a log-MAP algorithm, a feedback algorithm, and an optimization method is substantially applied piecewise within said forward, backward and current branch detectors and said soft-output detector to remove a dependence on parts of the received signal that are not constrained by backward state labels, forward state labels, and current branch metric labels.

8. The soft-output detector of claim 1, wherein a soft-output for one of binary and non-binary symbols are mapped from sets of bits constrained by the labels of the combined trellis structure.

9. The soft-output detector of claim 8, wherein the bits are precoded with $1/(1\oplus D)$ and wherein the log-likelihood ratios are calculated for an unprecoded binary symbol that corresponds to a $(1\oplus D)$ mapping of two precoded bits.

10. The soft-output detector of claim 1, wherein said backward detector has a reduced number of states at some trellis step.

11. A method for processing a received signal using a soft-output detector, comprising:
calculating forward state metrics using a forward detector;
calculating backward state metrics using a backward detector; and
calculating a current branch metric using a current branch detector, wherein at least two of said forward detector, said backward detector and said current branch detector employ trellis structures with a different maximum number of states.

12. The method of claim 11, wherein the forward detector uses a four state, radix $2^N$ trellis with or without feedback, where N is a number of received samples.

13. The method of claim 11, further comprising the step of unraveling said backward state metrics by setting initial backward state metrics to 0 and calculating a best path leaving each current backward state in a forward direction.

14. The method of claim 11, wherein each backward state metric represents a best path of length Q leaving a current backward state in a forward direction, where Q is one of N and 2N, and wherein the forward detector uses a radix $2^N$ trellis with N≥2, where N is a number of received samples.

15. The method of claim 11, wherein said log-likelihood ratios are calculated for a symbol using a combined trellis structure that contains all possible values of the symbol, wherein a combined metric for each possible symbol value is calculated by adding a forward state metric, a current branch metric, and a backward state metric and wherein a dependence on parts of the backward state label, current branch label, and forward state label is removed that do not directly map to the symbol value, wherein a hard-decision is the symbol value associated with the best combined metric in a set of combined metrics for all possible symbol values, wherein a magnitude of the log-likelihood ratio for each possible symbol value is obtained by substantially taking a difference between a best combined metric associated with that particular symbol value and a best combined metric in said set of combined metrics for all possible values.

16. The method of claim 11, wherein one or more of a max-log-MAP algorithm, a log-MAP algorithm, a feedback algorithm, and an optimization method is substantially applied piecewise within said forward, backward and current branch detectors and said soft-output detector to remove a dependence on parts of the received signal that are not constrained by backward state labels, forward state labels, and current branch metric labels.

17. The method of claim 11, wherein a soft-output for one of binary and non-binary symbols are mapped from sets of bits that are constrained by labels of the combined trellis structure.

18. The method of claim 17, wherein the bits are precoded with $1/(1\oplus D)$ and wherein the log-likelihood ratios are calculated for an unprecoded binary symbol that corresponds to a $(1\oplus D)$ mapping of two precoded bits.

19. The method of claim 11, wherein said backward detector has a reduced number of states at some trellis step.

20. The method of claim 11, further comprising the step of generating one or more log-likelihood ratios for one or more symbols based on said forward state metrics, backward state metrics, and current branch metric.

\* \* \* \* \*